(12) United States Patent
Hikita et al.

(10) Patent No.: US 6,766,149 B1
(45) Date of Patent: Jul. 20, 2004

(54) MOBILE RADIO TERMINAL AND SURFACE ACOUSTIC WAVE ANTENNA DUPLEXER

(75) Inventors: Mitsutaka Hikita, Kokubunji (JP); Kazuyuki Sakiyama, Mizusawa (JP); Naoki Matsuura, Mizusawa (JP); Nobuhiko Shibagaki, Kokubunji (JP)

(73) Assignee: Hitachi Media Electronics Co., Ltd., Iwate-ken (JP)

( * ) Notice: Subject to any disclaimer, the term of this patent is extended or adjusted under 35 U.S.C. 154(b) by 0 days.

(21) Appl. No.: 09/469,369

(22) Filed: Dec. 22, 1999

(30) Foreign Application Priority Data

Dec. 22, 1998 (JP) ............................................. 10-364074

(51) Int. Cl.⁷ .............................. H01Q 1/24; H04Q 7/32
(52) U.S. Cl. ................... 455/83; 455/575.3; 455/552.1; 455/323; 370/277; 333/100; 343/702
(58) Field of Search .............................. 455/552.1, 126, 455/120, 323, 307, 333, 334, 73, 83, 84, 82, 101, 553.1, 561, 575.3; 343/702, 725; 333/133, 193, 195, 100, 101; 370/277, 282, 342

(56) References Cited

U.S. PATENT DOCUMENTS

| | | | | | |
|---|---|---|---|---|---|
| 5,483,678 A | * | 1/1996 | Abe | .............................. | 455/80 |
| 5,864,260 A | * | 1/1999 | Lee | ............................. | 333/133 |
| 5,905,418 A | * | 5/1999 | Ehara et al. | ................. | 333/193 |
| 6,169,733 B1 | * | 1/2001 | Lee | ........................... | 455/552.1 |
| 6,535,166 B1 | * | 3/2003 | Ali | ....................... | 343/700 MS |

OTHER PUBLICATIONS

"IEEE Proceeding of Ultrasonics Symposium", p. 19–24 (1996).

* cited by examiner

Primary Examiner—Sinh Tran
Assistant Examiner—Kamran Afshar
(74) Attorney, Agent, or Firm—Crowell & Moring LLP

(57) ABSTRACT

An antenna duplexer is reduced in size, so that a dual-band/triple-band mobile radio terminal small in size and light in weight is realized. An off-set PLL modulation system is adopted, and a transmitting system of the antenna duplexer is constituted by switches. Further, in mounting an SAW filter, a multi-layer substrate is adopted, matching circuits and so on are formed by lumped-constant circuit elements, and the SAW filter is received in a space provided on the multi-layer substrate.

7 Claims, 10 Drawing Sheets

GSM and EGSM Frequency Allocation

PCN Frequency Allocation

PCS Frequency Allocation

MOBILE RADIO TERMINAL AND SURFACE ACOUSTIC WAVE ANTENNA DUPLEXER

BACKGROUND OF THE INVENTION

1. Field of the Invention

The present invention relates to a dual-band/triple-band mobile radio terminal, a surface acoustic wave (hereinafter referred to as "SAW") filter suitable for such a mobile radio terminal, or an antenna duplexer constituted by such an SAW filter and a high-frequency switch.

2. Description of the Related Art

In a mobile radio terminal, a single antenna is shared between transmission and reception through an antenna duplexer so as to transmit and receive transmission/reception signals adapted to a mobile communication system. A related-art antenna duplexer has a receiving dielectric resonator using a receiving frequency band as its passing frequency band, and a transmitting dielectric resonator using a transmitting frequency band as its passing frequency band. In addition, in the antenna duplexer, a matching circuit and a phase shift circuit are combined in order to prevent and reduce interference of the receiving and transmitting dielectric resonators with each other.

Mobile radio terminals small in size and light in weight have been under development for these years. Further, service which can use mobile radio terminals (dual-band or triple-band) adapted to a plurality of systems has been also in the planning stage. In such a state, in an antenna duplexer using dielectric resonators, its circuit wiring has become three-dimensional because the dielectric resonators are large in volume and heavy in weight. Thus, there has been a limit in making antenna duplexers and mobile radio terminals small in size and light in weight.

In order to cope with the requirement of making mobile radio terminals small in size and light in weight, an SAW antenna duplexer using SAW filters instead of dielectric resonators so as to miniaturize the antenna duplexer was developed, as disclosed in "IEEE Proceeding of Ultrasonics Symposium", p.19–24 (1996). FIG. 2 shows a circuit block diagram of such an antenna duplexer for a GSM system mobile radio terminal.

FIG. 1A shows a frequency allocation of a GSM system. A receiving frequency band $f_R$ ranges from 935 to 960 MHz, and a transmitting frequency band $f_T$ ranges from 890 to 915 MHz. An antenna duplexer 1 is connected to an antenna 2 through an antenna terminal 3 shared by a receiving system and a transmitting system. A reception signal supplied from the antenna 2 is supplied to the receiving system through the terminal 3 and a parallel connection point 4 which connects the receiving and transmitting systems. The reception signal is supplied to a receiving-system terminal 9 while desired receiving frequency characteristics are ensured. The receiving system includes an SAW filter 7 using the receiving frequency band $f_R$ as its passing frequency band, a matching circuit 6-1 for impedance-matching of the SAW filter 7, and a phase shift circuit 5-1 for suppressing leakage of a transmission signal into the receiving system. On the other hand, the transmission signal is supplied to the transmitting system through a transmitting-system terminal 10, and then supplied to the antenna 2 through the parallel connection point 4 and the terminal 3 while desired transmitting frequency characteristics are ensured. The transmitting system includes an SAW filter 8 using the transmitting frequency band $f_T$ as its passing frequency band, a matching circuit 6-2 for impedance-matching of the SAW filter 8, and a phase shift circuit 5-2 for suppressing leakage of the reception signal into the transmitting system.

In the related art, such an antenna duplexer used a dielectric single-layer substrate in which a signal pattern was formed on its upper surface and a ground pattern was formed on its lower surface, while elements constituting the SAW filters, phase shift circuits and matching circuits were mounted on its upper surface.

SUMMARY OF THE INVENTION

According to the present invention, a low-noise modulation system such as an off-set PLL modulation system is adopted and a transmitting system of an antenna duplexer is formed by a switch so that a mobile radio terminal suitable as a dual-band/triple-band one is realized. Particularly, in a triple-band mobile radio terminal, a transmitting system is shared by two mobile communication systems having transmitting frequency bands close to each other. Further, in mounting an SAW filter, a multi-layer substrate is adopted, and matching circuits and so on are formed by lumped-constant circuit elements, and the SAW filter is received in a space provided in the multi-layer substrate.

DETAILED DESCRIPTION OF THE PREFERRED EMBODIMENT

First Embodiment

Figure 2:
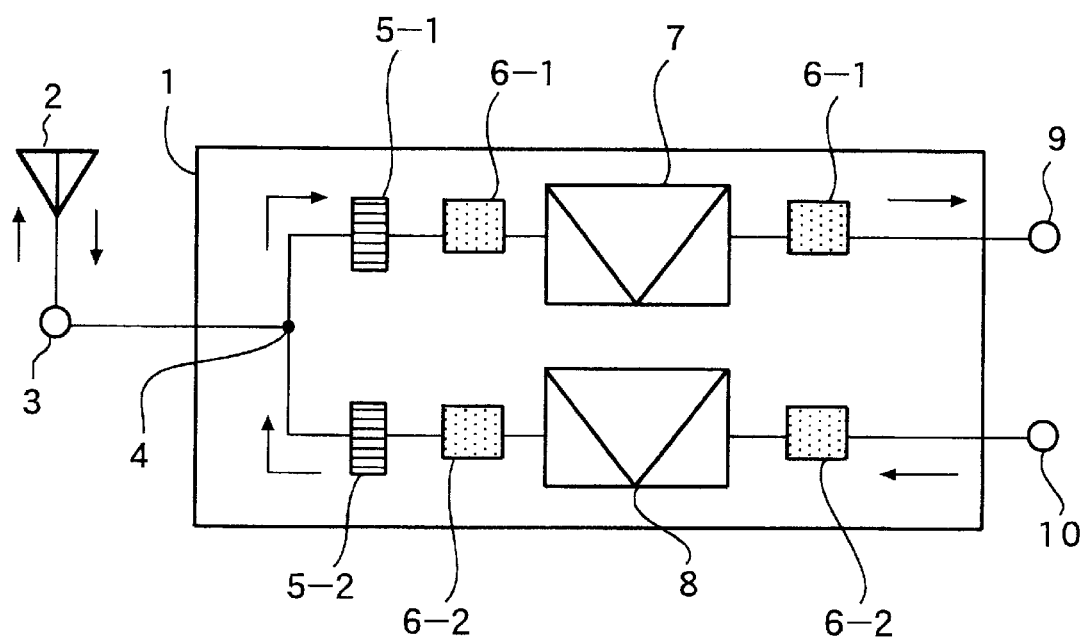
FIG. 2 is a circuit block diagram of an SAW antenna duplexer.
Figure 3A:
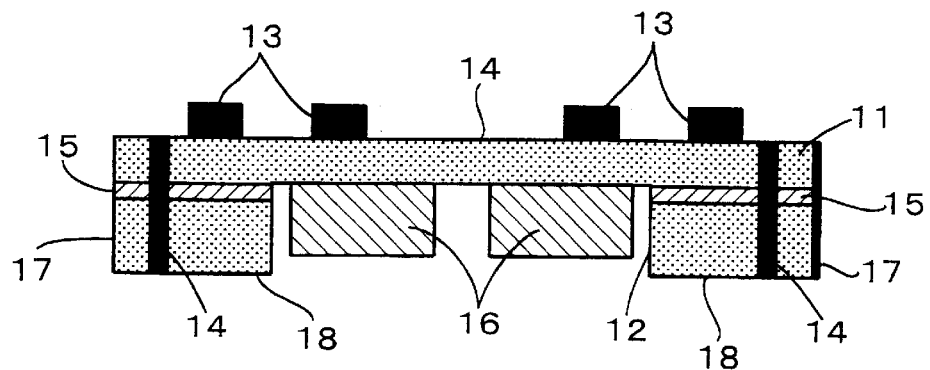
FIGS. 3A–3C are a sectional view, a top view and a bottom view of the antenna duplexer respectively.
Figure 3B:
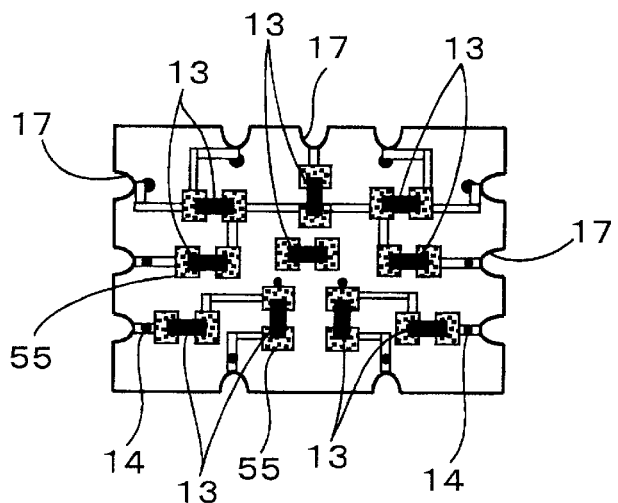
Figure 3C:
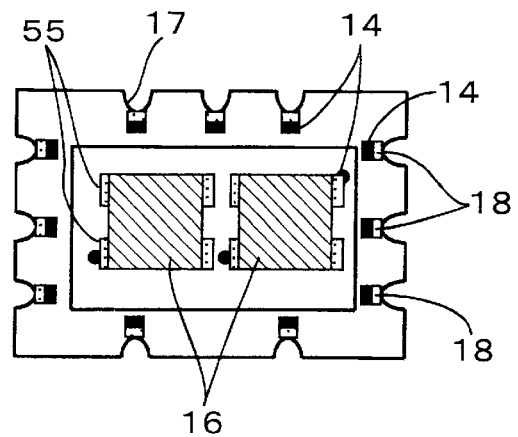

Mounting for reducing the size and weight of an SAW antenna duplexer shown in FIG. 2 is described as a first embodiment of the present invention. FIGS. 3A to 3C are a sectional view, a top view and a bottom view of the antenna duplexer respectively. This embodiment uses a dielectric multi-layer substrate in which first and second dielectric substrates (upper and lower dielectric substrates) 11 and 12 are bonded with each other through a bonding agent 15. Lumped-constant circuit elements 13 (chip capacities, chip inductors, helical coils, etc.) constituting phase shift circuits and matching circuits are mounted on the upper surface of the upper dielectric substrate 11 (the uppermost surface of the dielectric multi-layer substrate). A space is provided in a portion of the lower dielectric substrate 12 so as to receive SAW filters 16. Solder-coated portions (soldering lands) 55 for mounting the lumped-constant circuit elements 13 thereon are provided on the upper surface of the upper dielectric substrate 11, and soldering lands 55 for mounting the SAW filters 16 thereon are provided on the lower surface of the upper dielectric substrate 11. On the other hand, a signal terminal or ground terminal pattern 18 is provided on the lower surface of the lower dielectric substrate 12 (the lowermost surface of the dielectric multi-layer substrate) so as to be connected with signal lines and the ground on a board (not shown). The circuit pattern on the upper surface of the upper dielectric substrate 11 is electrically connected with the SAW filters 16 and the terminal pattern on the lower surface of the lower dielectric substrate 12 through conductors in through holes 14 and castellations 17. Glass epoxy resin which is rich in degree of freedom of working and inexpensive in cost is suitable for the multi-layer substrate. Glass ceramic or the like may be also used.

According to this embodiment, the SAW filters large in volume are built in the multi-layer substrate, and the lumped-constant circuit elements constituting matching circuits, phase shift circuits, and so on are disposed on the upper surface of the multi-layer substrate, so that the SAW antenna duplexer can be made smaller in size than a related-art SAW duplexer in which SAW filters and other elements are mounted on a single-layer substrate.

The lumped-constant circuit elements mounted on the upper surface of the upper dielectric substrate 11 are not limited to the phase shift circuits and matching circuits. The following embodiment will show an antenna duplexer using switching elements such as pin diodes, gallium arsenide ICs, etc. The antenna duplexer is suitable for a dual-mode/triple-mode mobile radio terminal. Those switching elements and bias circuits for driving the switching elements are also constituted by lumped-constant circuit elements, and the lumped-constant circuit elements are mounted on the upper surface of the upper dielectric substrate 11. As a result, the increase of the volume can be suppressed also in a large-circuit-scale antenna duplexer for a dual-mode/triple-mode mobile radio terminal.

Modifications of the first embodiment will be described below with reference to FIGS. 6 to 14.

Figure 6:
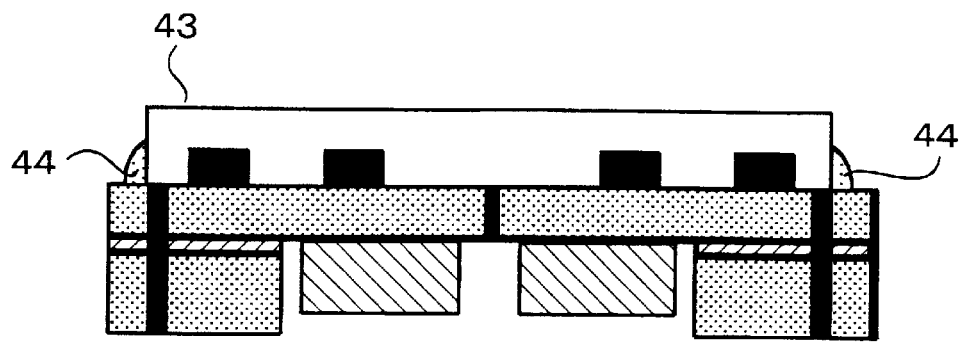
FIG. 6 is a sectional view of an antenna duplexer.

In FIG. 6, the upper surface of the upper dielectric substrate mounted with lumped-constant circuit elements, switching elements and so on is covered with a metal cap 43 from above. The metal cap 43 is connected with the ground pattern provided on the upper surface of the upper dielectric substrate. The connection is provided at one or more places of the metal cap 43 through solder or the like 44. As a result, the elements, circuit pattern and so on mounted on the upper surface of the upper dielectric substrate can be protected. In addition, the grounding capacity of the antenna duplexer can be enhanced, and surrounding electromagnetic waves can be prevented from affecting the antenna duplexer.

Figure 7:
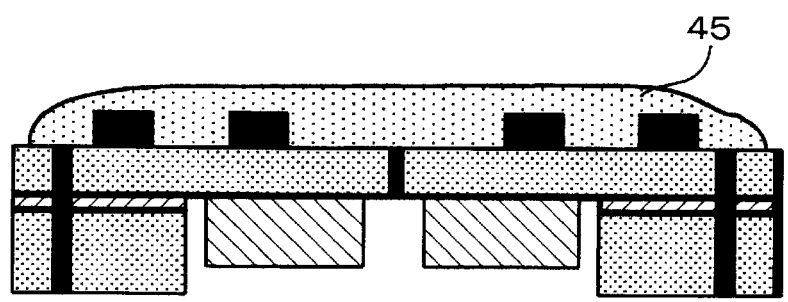
FIG. 7 is a sectional view of an antenna duplexer.

In FIG. 7, the upper surface of the upper dielectric substrate mounted with elements and so on is covered with resin 45. As a result, the elements and circuit pattern mounted on the upper surface of the upper dielectric substrate can be protected at a low cost.

Figure 8:
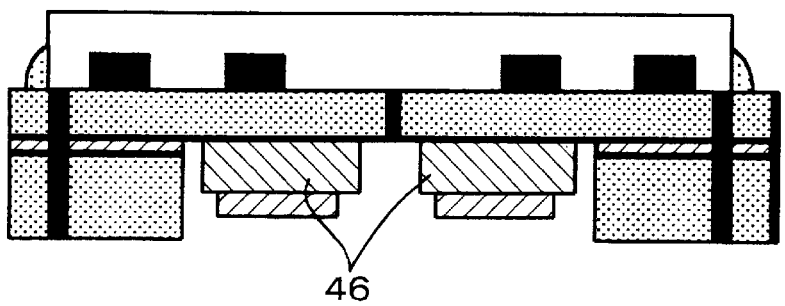
FIG. 8 is a sectional view of an antenna duplexer.

In FIG. 8, each mounted SAW filter is an SAW filter 46 received in a sheet-mounted package. The SAW filter received in a sheet-mounted package ensures the airtightness, and makes the working of handling the SAW filter easy.

Figure 9:
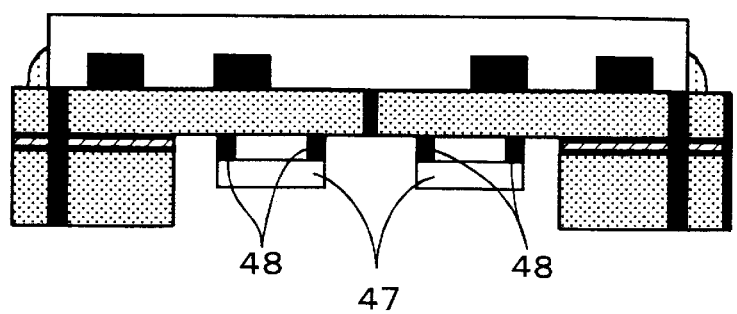
FIG. 9 is a sectional view of an antenna duplexer.

FIG. 9 shows an example in which SAW filter chips 47 are mounted on the SAW filters respectively with bumps 48 of gold, aluminum or the like by a flip-chip bonding method. This example is advantageous in reduction of area, thickness and cost.

Figure 10:
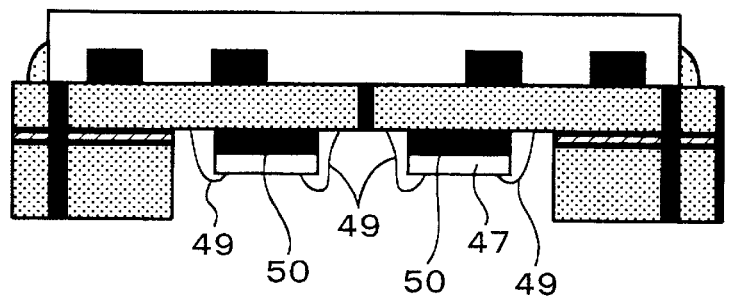
FIG. 10 is a sectional view of an antenna duplexer.

In FIG. 10, the SAW filter chips 47 are fixed to the substrate surface through a conductive or non-conductive bonding agent 50 while signal and ground patterns on the SAW filter chips 47 are electrically connected with the signal and ground patterns formed on the substrate surface through wires 49 of aluminum or the like. This example is advantageous in reduction of area, thickness and cost.

Figure 11:
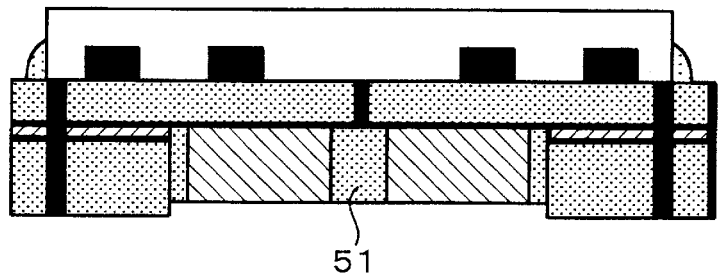
FIG. 11 is a sectional view of an antenna duplexer.

In FIG. 11, resin 51 of epoxy series or the like is injected around the plane-mounted SAW filters or the SAW filter chips mounted by a flip-chip bonding method. As a result, the SAW filters can be perfectly fixed, and foreign matters can be prevented from invading the SAW filters from the outside.

Figure 12:
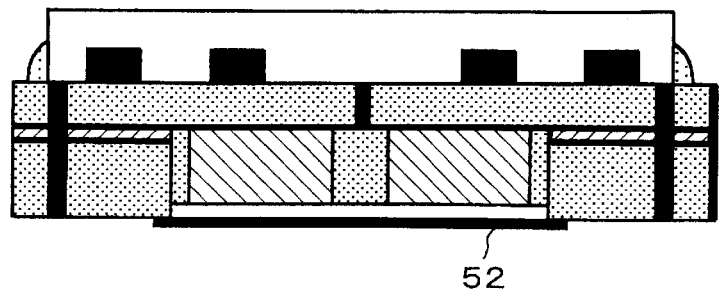
FIG. 12 is a sectional view of an antenna duplexer.

In FIG. 12, the space to receive the SAW filters provided on the multi-layer substrate is covered with a cover 52 of metal, resin or ceramic. The protection of the SAW filters can be reinforced.

Figure 13:
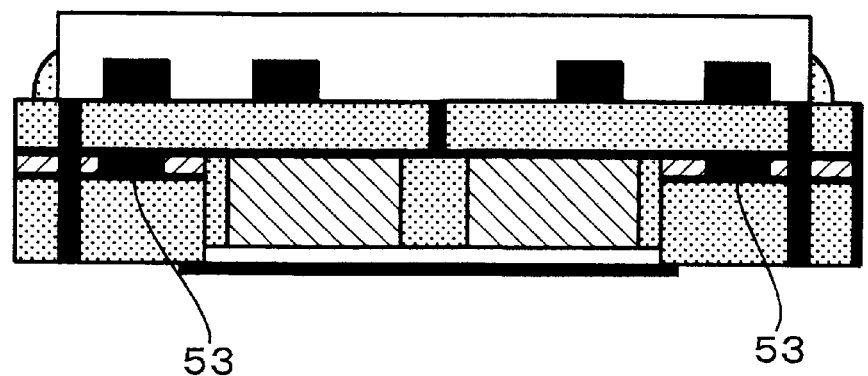
FIG. 13 is a sectional view of an antenna duplexer.

In FIG. 13, of the lumped-constant circuit elements mounted on the upper surface of the upper dielectric substrate in the example shown in FIG. 3, a part or all of the chip inductors and helical coils are replaced by spiral coils 53 formed on the lower surface of the upper dielectric substrate or the upper surface of the lower dielectric substrate. In comparison with the example shown in FIG. 3, the thickness of the bonding agent 15 bonding the upper and lower dielectric substrates 11 and 12 can be used effectively, and helical coils and so on can be eliminated from the upper surface of the upper dielectric substrate. As a result, there is an effect that the SAW antenna duplexer can be made thin. In addition, the number of coils mounted on the upper surface of the upper dielectric substrate is reduced. As a result, the antenna duplexer can be made low in cost.

Figure 14:
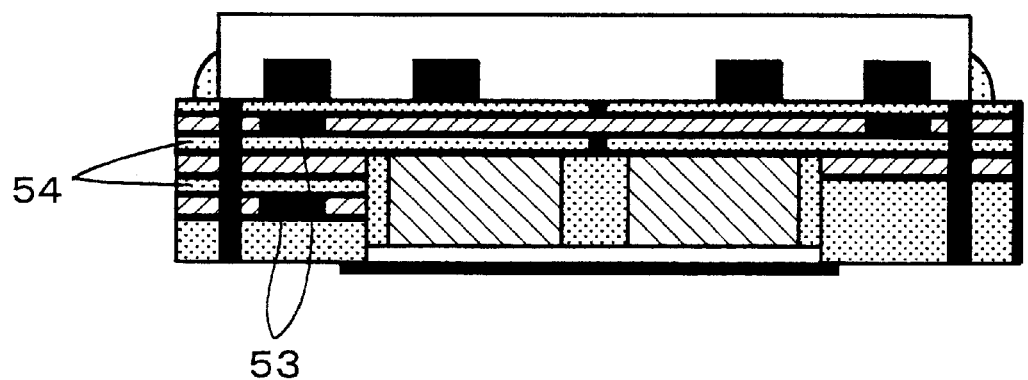
FIG. 14 is a sectional view of an antenna duplexer.

In FIG. 14, intermediate dielectric substrates 54 are provided between the upper and lower dielectric substrates. That is, the multi-layer substrate in this embodiment is not limited to one constituted by two dielectric substrates bonded with each other. In this case, the spiral coils 53 shown in the example of FIG. 13 are further provided on the intermediate dielectric substrates 54. Thus, a large number of spiral coils can be formed more advantageously in miniaturization.

Second Embodiment

With the expansion of use of mobile communication in recent years, a plurality of mobile communication systems have been used even in one country or region. For example, Europe is served by ETACS (Extended Total Access Communication System) which is an FDMA (Frequency Division Multiple Access) system, and GSM (Global System for Mobile Communication), EGSM (Extended Global System for Mobile Communication) or PCN (Personal Communication Network) which are TDMA (Time Division Multiple Access) systems. North America is served by EAMPS (Extended Advanced Mobile Phone Service) which is an FDMA system and PCS (Personal Communication System) which is a TDMA system. Japan is served by NTACS (New Total Access Communication System) which is an FDMA system and PDC (Personal Digital Cellular) which is a TDMA system. Under such conditions, it is preferable that a user can receive service from a plurality of systems through a single mobile radio terminal. FIG. 1 shows the frequency allocation of transmitting/receiving frequency bands of GSM, EGSM, PCN and PCS. For example, in Europe, service for dual-band mobile radio terminals useable in two systems of EGSM (800 MHz band) and PCN (1.8 GHz band) is in the planning stage. However, it is desirable that such dual-band mobile radio terminals and further triple-band mobile radio terminals are made small in size and light in weight.

Figure 16:
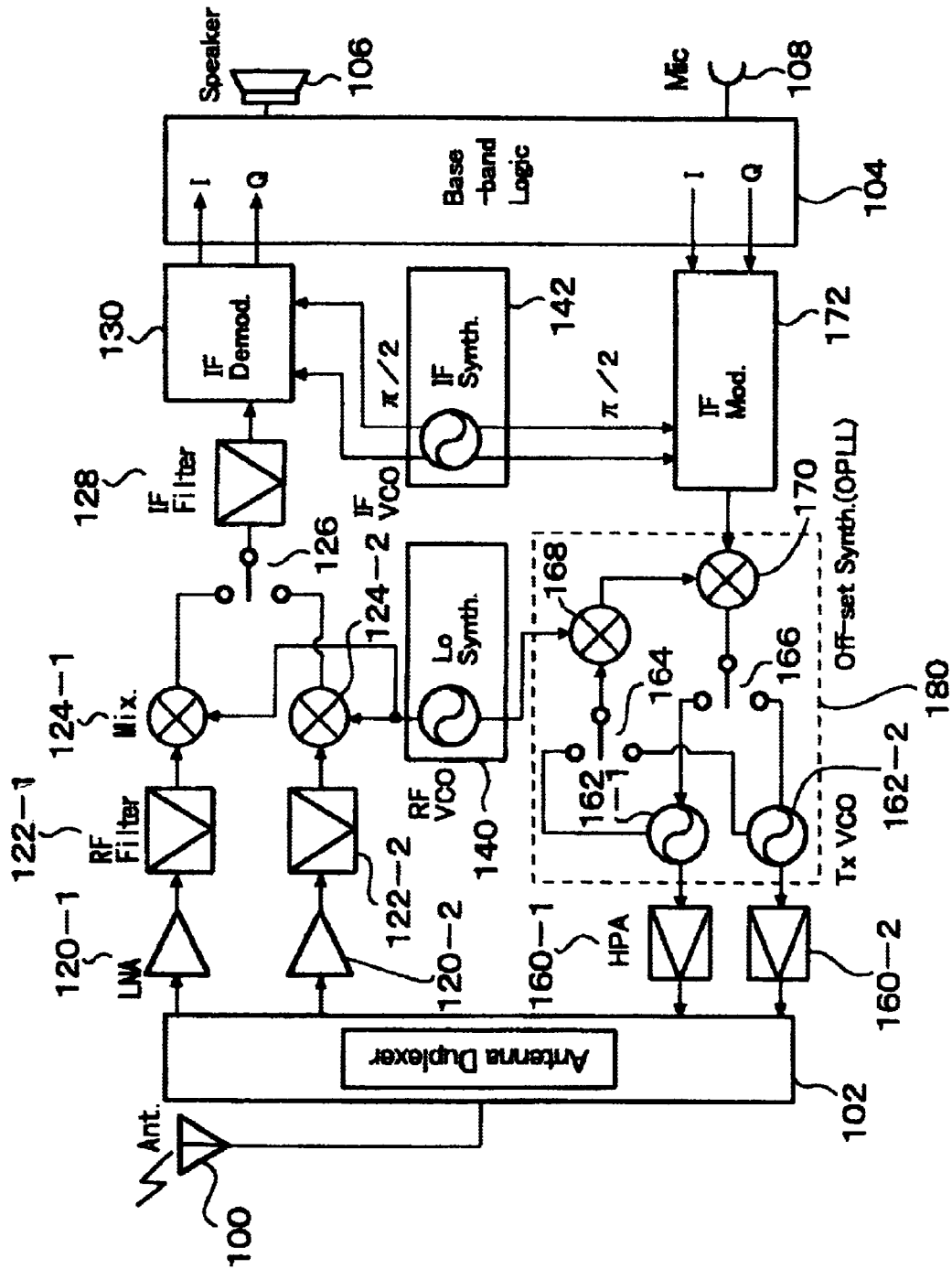
FIG. 16 is a circuit block diagram of a dual-band mobile radio terminal.

FIG. 16 shows a circuit block diagram of a dual-band mobile radio terminal.

First, description will be made about a receiving system thereof. A reception signal received by an antenna 100 is separated and shaped into reception signals adapted for respective systems in an antenna duplexer 102. A first carrier-frequency (RF) reception signal is amplified in a first low-noise amplifier (LNA) 120-1 adapted for a first mobile communication system. A second RF reception signal is amplified in a second LNA 120-2 adapted for a second mobile communication system. Each amplified RF reception signal is supplied to its corresponding radio-frequency filter 122 so as to obtain its desired reception frequency characteristics. The RF reception signal is supplied to its corresponding mixer 124 and mixed with a signal from a local oscillator 140 therein so as to be converted into an intermediate-frequency (IF) reception signal. The IF reception signal is supplied to an IF filter 128 through a switch 126 so as to obtain its desired intermediate-frequency characteristics. Incidentally, a control portion (not shown) of the mobile radio terminal changes over the switch 126 to the first RF system (120-1 to 124-1) when the terminal is in communication with a base station of the first mobile communication system, and to the second RF system (120-2 to 124-2) when the terminal is in communication with a base station of the second mobile communication system. Further, the IF reception signal is demodulated to a base-band reception signal by an IF demodulator 130, and the base-band reception signal is supplied to a base-band logic circuit 104. The IF reception signal is subjected to processing such as error correction, etc. in the logic circuit 104 and then outputted as voice from a speaker 106.

The local oscillator 140 may be designed so that the signals which the local oscillator 140 supplies to a plurality of mixers 124 do not have a common oscillation frequency but have oscillation frequencies corresponding to the respective systems. In that case, there is an advantage that the frequency of any IF reception signal can be set so as to be adapted to any characteristic of the IF filter 128. In addition, the reception signal is not always limited to a voice signal, but it may be a data signal.

Next, description will be made about a transmitting system. The voice output from a microphone 108 is converted into a base-band transmission signal in the logic circuit 104. The base-band transmission signal is converted into an IF transmission signal by an IF modulator 172, and the IF transmission signal is supplied to an off-set phase lock loop (off-set synthesizer) 180. The off-set synthesizer is a system which is extremely low in signal output of any frequency band other than a desired transmission frequency characteristic, in comparison with an orthogonal modulation system which was a typical one as an RF modulation system in the related art. As a result, there is required no filter for reducing noise in the reception frequency band, which was required in the orthogonal modulation system after the modulation of the transmission signal into the transmission frequency band. Incidentally, such an off-set synthesizer is shown, for example, in "ISSCC 97 Digest of Technical Papers" p.302–303 (1997).

The oscillator 162-1 (2) oscillates a signal of a frequency in the transmission frequency band of the first (second) mobile communication system. The signal oscillated from the oscillator 162 is mixed with a signal from the local oscillator 140 by a mixer 168. Incidentally, the local oscillator in the transmitting system is shown in common with the local oscillator in the receiving system, merely for the sake of simplification of the drawing. The frequency of the signal oscillated from the local oscillator 140 is now equal to the frequency obtained by subtracting the frequency of the IF transmission signal from the oscillation frequency of the oscillator 162. An output signal from the mixer 168 is further mixed with the IF transmission signal from the IF modulator 172 by a mixer 170. As a result, the mixer 170 outputs a DC signal. This DC signal drives the oscillator 162 so that the IF transmission signal is modulated into a carrier-frequency (RF) transmission signal. Then, switches 164 and 166 are changed over by a not-shown control portion in the same manner as in the receiving system. A first RF transmission signal outputted from the first oscillator 162-1 is amplified by a first high power amplifier (HPA) 160-1, and a second RF transmission signal outputted from the second oscillator 162-2 is amplified by a second HPA 160-2. Then, the transmission signal is outputted to the antenna 100 through the antenna duplexer 102. Incidentally, the transmission signal is not always limited to a voice signal, but may be a data signal.

Figure 1A:
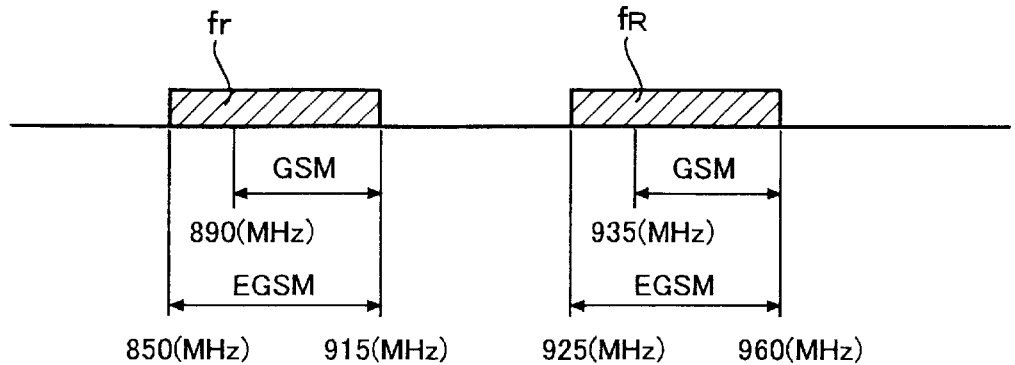
FIG. 1 is a diagram showing a transmitting/receiving frequency allocation in a mobile communication system.
Figure 1B:
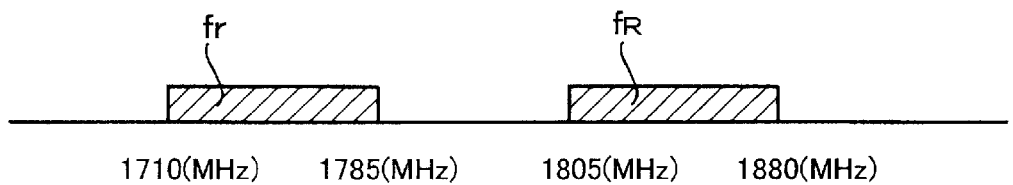

Description will be continued on the assumption that the first and second mobile communication systems are EGSM and PCN respectively. The transmitting and receiving frequency bands $f_T(1)$ and $f_R(1)$ of EGSM are in a range of from 880 to 915 MHz and in a range of from 925 to 960 MHz respectively as shown in FIG. 1A. The transmitting and receiving frequency bands $f_T(2)$ and $f_R(2)$ of PCN are in a range of from 1,710 to 1,785 MHz and in a range of from 1,805 to 1,880 MHz respectively as shown in FIG. 1B. Since the frequency bands of the two systems are thus at a large distance, there may be considered a system in which transmitting/receiving circuits adapted to the respective systems as shown in FIG. 2 are changed over by a switch in an antenna duplexer used for a dual-band mobile radio terminal. However, in such a system, the circuit scale is twice as large as a conventional one. In addition, when a switch is used for changing over the transmitting/receiving circuit, the efficiency of the switch is low because the frequencies used in EGSM and PCN are different from each other by approximately 1 GHz, so that the circuit scale further increases due to a circuit constituting the switch. Therefore, in this embodiment, it is noticed that noise in a receiving frequency band is kept in a low level even in an RF transmission signal amplified by an HPA in a low-noise RF modulation system represented by an off-set synthesizer. Since the noise in the receiving frequency band is kept in a low level in the amplified RF transmission signal, an SAW filter of a transmitting system used in a related-art antenna duplexer as shown in FIG. 2 is replaced by a switching element. As a result, it is possible to realize an antenna duplexer suitable for a dual-band/triple-band mobile radio terminal in which the circuit configuration is simplified.

Figure 4:
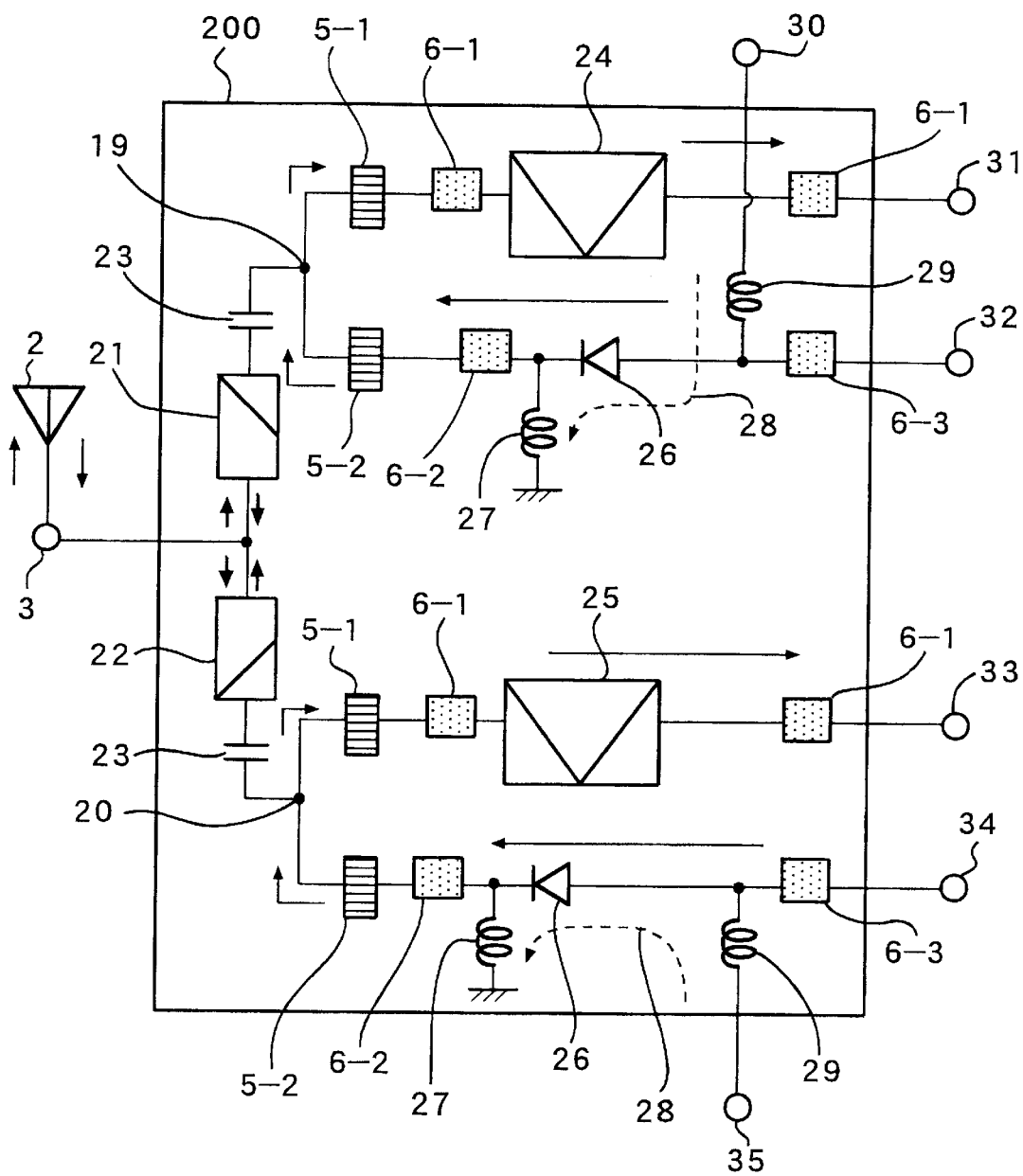
FIG. 4 is a circuit block diagram of an SAW antenna duplexer for a dual-band mobile radio terminal.

FIG. 4 shows a circuit block diagram of a dual-band antenna duplexer. Blocks having similar functions to those in FIG. 2 are referenced correspondingly. An antenna duplexer 200 has a first transmitting/receiving circuit for a first mobile communication system (EGSM) and a second transmitting/receiving circuit for a second mobile communication system (PCN). The respective transmitting/receiving circuits are connected in parallel with an antenna terminal 3 through filters 21 and 22 respectively. The filters 21 and 22 are determined in accordance with frequency bands used in the respective communication systems. The filter 21 is a low pass filter which passes signals in the frequency band used in EGSM, that is, in the frequency band of not higher than 960 MHz. On the other hand, the filter 22 is a high pass filter which passes signals in the frequency band used in PCN, that is, in the frequency band of not lower than 1,710 MHz.

The first transmitting/receiving circuit includes a receiving system constituted by a phase shift circuit 5-1, a matching circuit 6-1 and an SAW filter 24, and a transmitting system constituted by a phase shift circuit 5-2, matching circuits 6-2 and 6-3, and switching circuits 26, 27 and 29. The transmitting and receiving systems are connected in parallel with each other at a first parallel connection point 19. In such a parallel connection, it is necessary that, viewed from the parallel connection point, the impedance of the receiving system is made sufficiently high in the transmitting frequency band while the impedance of the transmitting system is made sufficiently high in the receiving frequency band so that signals can be prevented from leaking from one system into the other system.

In reception of EGSM, an EGSM reception signal outputted from the antenna terminal 3 is supplied to the receiving system through the low pass filter 21 and the first parallel connection point 19. Then, in order to restrain the leakage of the EGSM reception signal into the transmitting system, it is preferable that, viewed from the first parallel connection point 19, the absolute value of the reflection coefficient of the transmitting system including the switching circuits 26, 27 and 29 which are OFF is not less than 0.8 in the receiving frequency band $f_R(1)$.

In transmission of EGSM, an EGSM transmission signal outputted from an EGSM transmitting terminal 32 is supplied to the antenna terminal 3 through the switching circuits 26, 27 and 29 which are tuned ON by a driving current 28 supplied from a bias terminal 30, the first parallel connection point 19 and the low pass filter 21. Then, in order to restrain the leakage of the EGSM transmission signal into the receiving system, it is preferable that, viewed from the first parallel connection point 19, the absolute value of the reflection coefficient of the receiving system including the SAW filter 24 is not less than 0.8 in the transmitting frequency band $f_T(1)$. Each of the matching circuits 6-2 and 6-3 in the transmitting system may have not only a function of impedance matching between the switching circuits but also a function as a low pass filter for eliminating second and third harmonics generated in the HPA. The driving current 28 outputted from the bias terminal 30 is grounded through the bias circuit 29, the switching element 26 and the feedback circuit 27. A capacity 23 is provided for preventing this bias current from leaking from the transmitting system into the antenna terminal 3. The absolute value of the reflection coefficient will be described later.

The phase shift circuit 5-1 or 5-2 has a function of setting the optimum condition that the impedance of the transmitting or receiving system takes a maximum value in the receiving or transmitting frequency band. In this condition, the real part of the impedance is made maximum. Such a condition is achieved by a phase shift circuit, as well known in network theory. The phase shift circuit can be realized by a known circuit constituted by capacities, inductors, etc.

Figure 15:
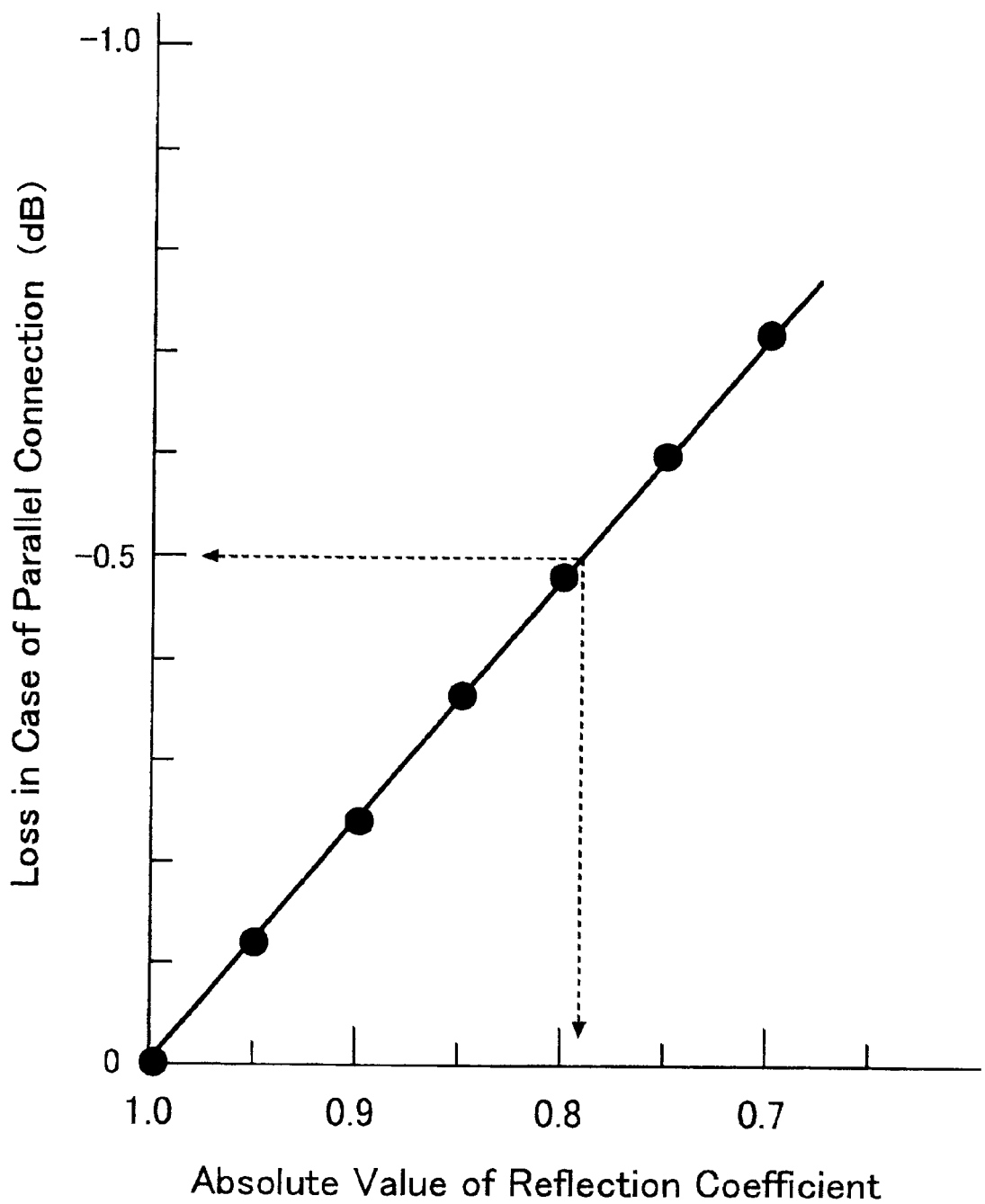
FIG. 15 is a correlation graph between the absolute value of a reflection coefficient and the loss in parallel connection.

FIG. 15 shows a relationship between the absolute value ($|\Gamma|$) of the reflection coefficient of the receiving (or transmitting) system and the loss (IL(dB)) in parallel connection when the impedance of the transmitting or receiving system is set to the optimum condition. Then, the loss in parallel connection IL(dB) is expressed by:

$$IL(dB) = -20\log_{10}(2\times(1+|\Gamma|)/(|\Gamma|+3)$$

In order to reduce the loss in parallel connection to 0.5 dB or less so that there is no problem in practical use, the absolute value of the reflection coefficient needs to be about 0.8 or more.

The SAW filter or switching circuits may have a function as the phase shift circuits 5 or the matching circuits 6. If these functions are achieved by the SAW filter or switching circuits, the circuits 5 and 6 can be omitted. Further, if the optimum condition of impedance is achieved by the SAW filter or switching circuits, and the matching circuits 6, the phase shift circuits 5 can be omitted.

The second transmitting/receiving circuit includes a receiving system constituted by a phase shift circuit 5-1, a matching circuit 6-1 and an SAW filter 25, and a transmitting system constituted by a phase shift circuit 5-2, matching circuits 6-2 and 6-3, and switching circuits 26, 27 and 29. The transmitting and receiving systems are connected in parallel with each other at a second parallel connection point 20. Blocks having similar functions to those of the first transmitting/receiving circuit are referenced correspondingly.

In reception of PCN, a PCN reception signal outputted from the antenna terminal 3 is supplied to the receiving system through the high pass filter 22 and the second parallel connection point 20. Then, in the same manner as in the first transmitting/receiving circuit, in order to restrain the leakage of the PCN reception signal into the transmitting system, it is preferable that, viewed from the second parallel connection point 20, the absolute value of the reflection coefficient of the transmitting system including the switching circuits 26, 27 and 29 which are OFF is not less than 0.8 in the receiving frequency band $f_R(2)$.

In transmission of PCN, a PCN transmission signal outputted from a PCN transmitting terminal 34 is supplied to the antenna terminal 3 through the switching circuits 26, 27 and 29 which are tuned ON by the driving current 28 supplied from a bias terminal 35, the second parallel connection point 20 and the high pass filter 22. Then, in the same manner as in the first transmitting/receiving circuit, in order to restrain the leakage of the PCN transmission signal into the receiving system, it is preferable that, viewed from the second parallel connection point 20, the absolute value of the reflection coefficient of the receiving system including the SAW filter 25 is not less than 0.8 in the transmitting frequency band $f_T(2)$.

To which bias terminal 30 or 35 the bias current is supplied is controlled by a not-shown control portion in accordance with transmission of EGSM or PCN.

The antenna duplexer shown in this embodiment can be miniaturized also from the point of view of mounting when the mounting is performed by using the multi-layer substrate shown in the first embodiment. In this case, the matching circuits, the phase shift circuits, the switching circuits, the bias circuits, etc. are constituted by lumped-constant circuit elements and mounted on the upper surface of the upper dielectric substrate. In addition, the SAW filters for EGSM and PCN are received in a space provided in the lower dielectric substrate. The mobile communication systems for providing service are not always limited to EGSM and PCN, but this embodiment is applicable to an antenna duplexer adapted to a combination of other mobile communication systems such as a W-CDMA system with a 2 GHz band and so on.

Third Embodiment

In any country or in any region, portable telephone service was opened initially by using a system with transmitting and receiving frequency bands near an 800 MHz band. With the sudden increase of users, service based on a system with transmitting and receiving frequency bands in a 1.5 to 2.0 GHz band was started. In reflection of such circumstances of increased available frequencies, frequency bands used in respective mobile communication systems are roughly classified into ones near the 800 MHz band and ones in the 1.5 to 2.0 GHz band. Of representative mobile communication systems, systems using frequencies near the 800 MHz band include NTACS ($f_R$=843–870 MHz, $f_T$=898–925 MHz), NTT ($f_R$=870–885 MHz, $f_T$=925–940 MHz), EAMPS ($f_R$=869–894 MHz, $f_T$=824–849 MHz), ETACS ($f_R$=917–950 MHz, $f_T$=872–905 MHz), PDC800 ($f_R$=810–826 MHz, $f_T$=940–956 MHz), GSM, J-CDMA ($f_R$=832–870 MHz, $f_T$=887–925 MHz), etc. On the other hand, systems using frequencies in the 1.5 to 2.0 GHz band include PDC1.5 ($f_R$=1,477–1,501 MHz, $f_T$=1,429–1,453 MHz), PCN, PCS, W-CDMA ($f_R$=2,110–2,170 MHz, $f_T$=1,920–1,980 MHz), etc.

Figure 1C:
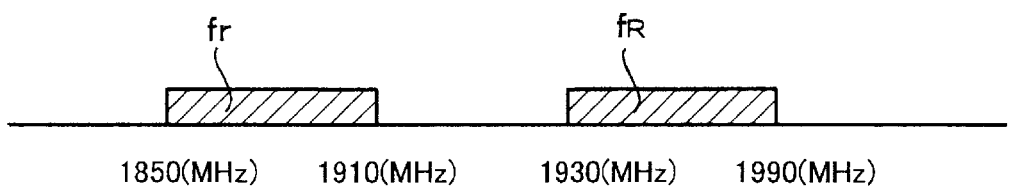

Currently, mobile radio terminal service adapted to three systems available in two regions is in the planning stage. For example, there is a plan to provide triple-band mobile radio terminal service in which PCS in U.S. is added to the two systems of EGSM and PCN in Europe. In this case, the transmitting and receiving frequency bands $f_T(1)$ and $f_R(1)$ of EGSM are in a range of from 880 to 915 MHz and in a range of from 925 to 960 MHz respectively as shown in FIG. 1A. The transmitting and receiving frequency bands $f_T(2)$ and $f_R(2)$ of PCN are in a range of from 1,710 to 1,785 MHz and in a range of from 1,805 to 1,880 MHz respectively as shown in FIG. 1B. The transmitting and receiving frequency bands $f_T(3)$ and $f_R(3)$ of PCS are in a range of from 1,850 to 1,910 MHz and in a range of from 1,930 to 1,990 MHz respectively as shown in FIG. 1C. For such three mobile communication systems, it is difficult to further miniaturize an antenna duplexer. In this embodiment, from the aforementioned circumstances of mobile communication systems, there is a high possibility that the triple-band mobile radio terminal is adapted to a combination of mobile communication systems which include one 800 MHz band system and two other 1.5–2.0 GHz band systems, or two 800 MHz band systems and one other 1.5–2.0 GHz band system. Therefore, parts of circuits are shared between the two systems using neighboring frequency bands so that the circuit scale is reduced.

Description will be continued on the assumption that the first mobile communication system is EGSM, the second mobile communication system is PCN and the third mobile communication system is PCS. The circuit configuration of the triple-band mobile radio terminal is also based on FIG. 16. However, in order to make the mobile communication terminal adapt to the three mobile communication systems, three RF systems are required on the receiving system side, and oscillators of an off-set synthesizer and HPAs are required for three transmitting frequency bands on the transmitting system side.

A basic configuration of the antenna duplexer is provided with a first transmitting/receiving circuit adapted to the 800 MHz band system (EGSM), and a second transmitting/receiving circuit adapted to the 1.5–2.0 GHz band systems (PCN and PCS). In the first transmitting/receiving circuit, a first transmitting system and a first receiving system are connected in parallel with each other in the same manner as in the second embodiment. On the other hand, in the second transmitting/receiving circuit, a transmitting system is shared between PCN and PCS because PCN and PCS have transmitting frequency bands close to each other as shown in FIGS. 1B and 1C. In addition, since the receiving frequency bands of PCN and PCS are close to each other and do not overlap with each other, a second receiving system adapted to PCN and a third receiving system adapted to PCS are connected in parallel with each other. Further, the receiving systems connected in parallel and the transmitting system (second transmitting system) are connected in parallel.

Thus, in the same manner as in the second embodiment, in order to restrain the leakage of a transmission signal into any receiving system and the leakage of a reception signal into any transmitting system, it is necessary that, viewed from the parallel connection point between the receiving system and the transmitting system, the impedance of the transmitting (receiving) system is made sufficiently high in the receiving (transmitting) frequency band. Further, in order to restrain the leakage of a PCN reception signal into the third receiving system and the leakage of a PCS reception signal into the second receiving system, it is necessary that, viewed from the parallel connection point between the second and third receiving systems, the impedance of the second (third) receiving system is made sufficiently high in the PCS (PCN) receiving frequency band.

Figure 5:
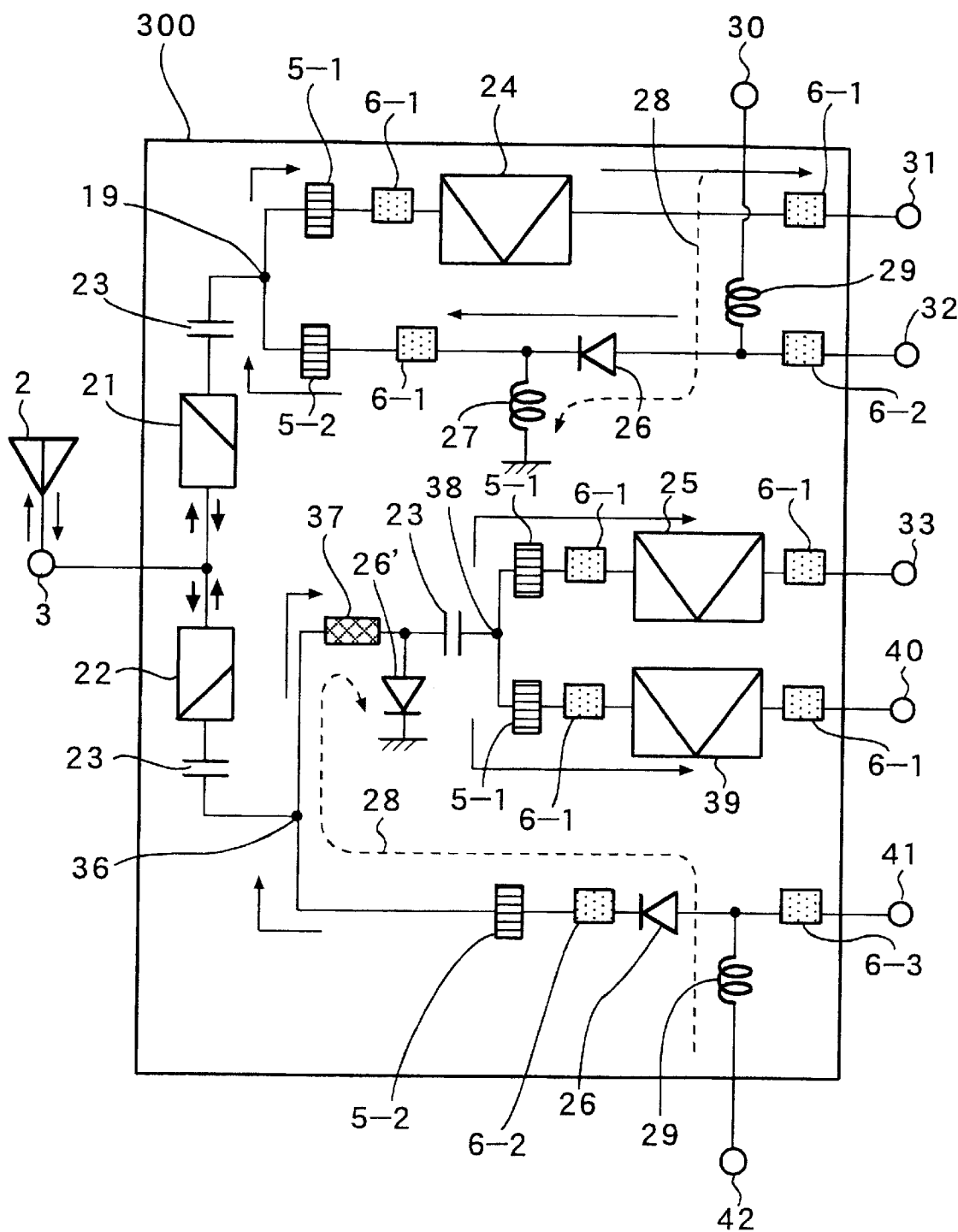
FIG. 5 is a circuit block diagram of an SAW antenna duplexer for a triple-band mobile radio terminal.

FIG. 5 shows a circuit block diagram of a triple-band antenna duplexer. Blocks having similar functions to those in FIGS. 2 and 4 are referenced correspondingly. An antenna duplexer 300 includes a first transmitting/receiving circuit for a first mobile communication system (EGSM) and a second transmitting/receiving circuit for second and third mobile communication systems (PCN and PCS). The respective transmitting/receiving circuits are connected in parallel with an antenna terminal 3 through filters 21 and 22 respectively. The filter 21 is a low pass filter which passes signals of the frequency band not higher than 960 MHz which is used in EGSM. On the other hand, the filter 22 is a high pass filter which passes signals of the frequency band not lower than 1,710 MHz which is used in PCN and PCS. Description is omitted as to the circuit configuration and operation of the first transmitting/receiving circuit because they are similar to those which were described in the second embodiment.

Description will be made about the second transmitting/receiving circuit. The circuit includes a second receiving system constituted by phase shift circuits 5-1, matching circuits 6-1, and SAW filters 25 and 39, and a second transmitting system constituted by a phase shift circuit 5-2, matching circuits 6-2 and 6-3, and switching circuits 26 and 29. The second receiving and transmitting systems are connected in parallel with each other at a parallel connection point (referred to as "third parallel connection point") 36. In addition, the receiving system is provided with second and third receiving systems each constituted by a phase shift circuit, a matching circuit and an SAW filter so as to be adapted to PCN and PCS. The second and third receiving systems are connected in parallel with each other at a parallel connection point (referred to as "fourth parallel connection point") 38.

In reception of PCN, a PCN reception signal outputted from the antenna terminal 3 is supplied to the receiving system through the high pass filter 22 and the third parallel connection point 36. Further, the signal is supplied to the second receiving system adapted to PCN through the fourth parallel connection point 38. Then, in order to restrain the leakage of the PCN reception signal into the third receiving system adapted to PCS, it is preferable that, viewed from the fourth parallel connection point 38, the absolute value of the reflection coefficient of the third receiving system including the SAW filter 39 is not less than 0.8 in the receiving frequency band $f_R(2)$.

In reception of PCS, a PCS reception signal is supplied to the receiving system in the same manner as in the PCN signal, and the PCS reception signal is supplied to the third receiving system adapted to PCS through the fourth parallel connection point 38. Then, in order to restrain the leakage of the PCS reception signal into the second receiving system adapted to PCN, it is preferable that, viewed from the fourth parallel connection point 38, the absolute value of the reflection coefficient of the second receiving system including the SAW filter 25 is not less than 0.8 in the receiving frequency band $f_R(3)$.

Further, in order to restrain the leakage of the PCN or PCS reception signal into the second transmitting system, it is preferable that, viewed from the third parallel connection point 36, the absolute value of the reflection coefficient of the second transmitting system including the switching circuits 26 and 29 which are OFF is not less than 0.8 in the receiving frequency bands $f_R(2)$ and $f_R(3)$.

In transmission of PCN or PCS, a PCN or PCS transmission signal outputted from a transmitting terminal 41 is supplied to the antenna terminal 3 through the switching circuits 26 and 29 which are tuned ON by a driving current 28 supplied from a bias terminal 42, the third parallel connection point 36 and the high pass filter 22. Then, in order to restrain the leakage of the PCN or PCS transmission signal to the receiving system, it is preferable that, viewed from the third parallel connection point 36, the absolute value of the reflection coefficient of the receiving system including the SAW filters 25 and 39 is not less than 0.8 in the transmitting frequency bands $f_T(2)$ and $f_T(3)$.

The driving current 28 is outputted from the bias terminal 42 and grounded through the bias circuit 29, the switching element 26, a phase shift circuit 37 and the switching element 26'. This phase shift circuit 37 has the same function as a quarter-wave line so as to restrain the leakage of the PCN or PCS transmission signal into the receiving system. The receiving system is OFF when the switching elements 26 and 26' are ON so that the driving current 28 flows into the phase shift circuit 37. The receiving system is ON when the switching elements 26 and 26' are OFF so that the driving current 28 does not flow into the phase shift circuit 37. Therefore, the phase shift circuit 37 is designed so that the impedance of the receiving system is made maximum viewed from the third parallel connection point 36 when the driving current 28 is flowing into the phase shift circuit 37, and the impedance of the receiving system is made minimum viewed from the third parallel connection point 36 when the driving current 28 is not flowing into the phase shift circuit 37. The phase shift circuit 37 may be formed by a known circuit configuration with capacities, inductors, etc.

The parallel connections between the second transmitting system and the receiving system and between the second and third receiving systems may be replaced by the switching of switching elements.

Brief description will be made about the frequency allocation of two mobile communication systems sharing a transmitting system. In this case, in order to restrain the leakage of reception signals of the two mobile communication systems into the common transmitting system and the leakage of transmission signals of the two mobile communication systems into the receiving system, it is preferable that, viewed from the third parallel connection point 36, the absolute value of the reflection coefficient of each of the transmitting and receiving systems is ensured to be not less than 0.8. Generally, as the frequency band is narrower, it is easier to keep a large absolute value of a reflection coefficient. It is therefore preferable that a frequency distance between min(the lowest frequency of $f_T(2)$, the lowest frequency of $f_T(3)$) and max(the highest frequency of $f_T(2)$, the highest frequency of $f_T(3)$) and a frequency distance between min(the lowest frequency of $f_R(2)$, the lowest frequency of $f_R(3)$) and max(the highest frequency of $f_R(2)$, the highest frequency of $f_R(3)$) are as narrow as possible. In addition, in order to separate reception signals of the two mobile communication systems, it is necessary that the receiving frequency bands of the two systems do not overlap with each other.

The above description was made about an example of a triple-band mobile radio terminal adapted to one system using a frequency band near an 800 MHz band and two systems using frequency bands in a 1.5–2.0 GHz band. However, similar configuration can be applied to a triple-band mobile radio terminal adapted to two systems using frequency bands near an 800 MHz band and one system using a frequency band in a 1.5–2.0 GHz band. In this case, a transmitting/receiving circuit corresponding to the second transmitting/receiving circuit described above is connected to a low pass filter connected to the antenna terminal 3, and a transmitting/receiving circuit corresponding to the first transmitting/receiving circuit described above is connected to a high pass filter connected to the antenna terminal 3.

The antenna duplexer shown in this embodiment can be miniaturized also from the point of view of mounting when the mounting is performed by using the multi-layer substrate shown in the first embodiment. In this case, the matching circuits, the phase shift circuits, the switching circuits, the bias circuits, etc. are constituted by lumped-constant circuit elements and mounted on the upper surface of the upper dielectric substrate. In addition, the SAW filters for EGSM, PCN and PCS are received in a space on the lower dielectric substrate. The mobile communication systems for providing service are not always limited to EGSM, PCN and PCS, but this embodiment is applicable to an antenna duplexer adapted to a predetermined combination of other mobile communications.

According to the present invention, an antenna duplexer can be miniaturized so that a dual-band/triple-band mobile radio terminal small in size and light in weight can be realized.

What is claimed is:

1. A switching antenna duplexer sharing a single antenna between two systems using different transmitting $f_T(1)$, $f_T(2)$ and receiving $f_R(1)$, $f_R(2)$ frequencies respectively;

wherein said frequencies of said two systems such that $f_T(1) < f_T(2)$ and $f_R(1) < f_R(2)$ when transmitting and receiving frequency bands of a first one of said two systems are represented by $f_T(1)$ and $f_R(1)$ respectively and transmitting and receiving frequency bands of a second one of said two systems are represented by $f_T(2)$ and $f_R(2)$;

wherein a signal adapted to said first system and a signal adapted to said second system share an antenna terminal through a low pass filter and a high pass filter respectively;

wherein a reception signal in said frequency band $f_R(1)$ inputted from said antenna is received through said antenna terminal and sent to a receiving-system terminal adapted to said first system through said low pass filter, a first parallel connection point and a separate filter, said first parallel connection point being a connection point between receiving and transmitting systems adapted to said first system, said separate filter having said frequency band $f_R(1)$ as its pass band and having a reflection coefficient the absolute value of which is not less than 0.8 in the frequency band $f_T(1)$ viewed from said first parallel connection point;

wherein a transmission signal in said frequency band $f_T(1)$ is inputted to a transmitting-system adapted to said first system, and sent to said antenna terminal through a switching circuit, said first parallel connection point and said low pass filter, said switching circuit having a reflection coefficient the absolute value of which is not less than 0.8 in the frequency band $f_R(1)$ viewed from said first parallel connection point when said switching circuit is OFF;

wherein a reception signal in said frequency band $f_R(2)$ inputted from said antenna is received through said antenna terminal and sent to a receiving-system terminal adapted to said second system through said high pass filter, a second parallel connection point and a second separate filter, said second parallel connection point being a connection point between receiving and transmitting systems adapted to said second system, said second separate filter having said frequency band $f_R(2)$ as its pass band and having a reflection coefficient the absolute value of which is not less than 0.8 in the frequency band $f_T(2)$ viewed from said second parallel connection point;

wherein a transmission signal in said frequency band $f_T(2)$ is inputted to a transmitting-system adapted to said second system, and sent to said antenna terminal through a switching circuit, said second parallel connection point and said high pass filter, said switching circuit having a reflection coefficient the absolute value of which is not less than 0.8 in the frequency band $f_R(2)$ viewed from said second parallel connection point when said switching circuit is OFF.

2. A switching antenna duplexer according to claim 1, comprising:

a multi-layer substrate constituted by at least two dielectric substrate layers having signal, ground and bias patterns formed thereon;

at least lower one of said dielectric substrate layers being partly removed to thereby form a space in the bottom of said multi-layer substrate, so that said signal pattern and ground pattern formed on a lower surface of the other upper dielectric substrate layer is exposed in said space;

at least said first and second separate filters mounted in said space and on said signal and ground patterns which are formed on a lower surface of another substrate layer exposed in said space;

at least one lumped-constant circuit element and at least one switching element mounted on an upper surface of an uppermost one of said dielectric substrate layers, and connected with the signal terminal pattern which is connected to said antenna through said low-pass and high-pass filters; and signal-terminal, ground-terminal and bias-terminal patterns to be connected to the outside, said terminal patterns being formed on a lower surface of a lower-most one of said dielectric substrate layers, said signal, ground and bias terminal patterns being connected with said signal, ground and bias patterns provided on said respective dielectric substrate layers.

3. A switching antenna duplexer sharing a single antenna among three systems using different transmitting and receiving frequencies respectively, transmitting and receiving frequency bands of a first one of said three systems being $f_T(1)$ and $f_R(1)$ respectively, transmitting and receiving frequency bands of a second one of said three systems being $f_T(2)$ and $f_R(2)$, transmitting and receiving frequency bands of a third one of said three systems being $f_T(3)$ and $f_R(3)$;

wherein a signal adapted to said first system, a signal adapted to said second system and a signal adapted to said third system share an antenna terminal through a low pass filter and a high pass filter respectively;

wherein a reception signal in said frequency band $f_R(1)$ inputted from said antenna is received through said antenna terminal and sent to a receiving-system terminal adapted to said first system through said low pass filter, a first parallel connection point and a first separate filter, said first parallel connection point being a connection point between receiving and transmitting systems adapted to said first system, said separate filter having said frequency band $f_R(1)$ as its pass band and having a reflection coefficient the absolute value of which is not less than 0.8 in the frequency band $f_T(1)$ viewed from said first parallel connection point;

wherein a transmission signal in said frequency band $f_T(1)$ is inputted to a transmitting-system adapted to said first system, and sent to said antenna terminal through a switching circuit, said first parallel connection point and said low pass filter, said switching circuit having a reflection coefficient the absolute value of which is not less than 0.8 in the frequency band $f_R(1)$ viewed from said first parallel connection point when said switching circuit is OFF;

wherein reception signals in said frequency bands $f_R(2)$ and $f_R(3)$ inputted from said antenna are received through said antenna terminal and sent to receiving-system terminals adapted to said second and third systems through said high pass filter, a third parallel connection point, a switching circuit, a fourth parallel connection point and second and third separate filters respectively, said third parallel connection point being a connection point between receiving and transmitting systems adapted to said second and third systems, said switching circuit having a reflection coefficient the absolute value of which is not less than 0.8 in the frequency bands $f_T(2)$ and $f_T(3)$ viewed from said third parallel connection point when said switching circuit is OFF, said fourth parallel connection point being a connection point between receiving systems of said second and third systems, one of said second and third separate filters having said frequency and $f_R(2)$ as its pass band and having a reflection coefficient the absolute value of which is not less than 0.8 in the frequency band $f_R(3)$ viewed from said fourth parallel connection point, the other of said second and third separate filters having said frequency band $f_R(3)$ as its pass band and having a reflection coefficient the absolute value of wherein transmission signals in said frequency bands $f_R(2)$ and $f_R(3)$ adapted to the second and third systems are inputted to a transmitting-system and sent to said antenna terminal through a switching circuit, said third parallel connection point and said high pass filter, said switching circuit having a reflection coefficient the absolute value of which is not less than 0.8 in the frequency bands $f_R(2)$ and $f_R(3)$ viewed from said third parallel connection point when said switching circuit is OFF.

4. A switching antenna duplexer, sharing a single antenna among three systems using different transmitting and receiving frequencies respectively, transmitting frequency bands of said three systems being $f_T(1)$, $f_T(2)$ and $f_T(3)$, receiving frequency bands being $f_R(1)$, $f_R(2)$ and $f_R(3)$, according to claim 3;

wherein switching is performed between said low pass filer and said high pass filter, between said transmitting system adapted to said frequency band $f_T(1)$ and said transmitting system adapted to said frequency band $f_T(3)$ and between said receiving system adapted to said frequency band $f_R(1)$ and said receiving system adapted to said frequency band $f_R(3)$ so that said transmitting and receiving systems adapted to said transmitting frequency bands $f_T(1)$ and $f_T(2)$ and said receiving frequency bands $f_R(1)$ and $f_R(2)$ are connected to said antenna terminal through said low pass filter, and said transmitting and receiving-systems adapted to said transmitting frequency band $f_T(3)$ and said receiving frequency band $f_R(3)$ are connected to said antenna terminal through said high pass filter.

5. A switching antenna duplexer according to claim 3, or 4, comprising:

a multi-layer substrate constituted by at lest two dielectric substrate layers having signal, ground and bias patterns formed thereon;

at least a lower one of said dielectric substrate layers being partly removed to thereby form a space in the bottom of said multi-layer substrate, so that said signal pattern and ground pattern formed on a lower surface of the other upper dielectric substrate layer is exposed in said space;

at least said first, second and third separate filters mounted in said space and on said signal and ground patterns which are formed on a lower surface of another substrate layer exposed in said space;

at least one lumped-constant circuit element and at least one switching element mounted on an upper surface of an uppermost one of said dielectric substrate layers, and connected with the signal terminal pattern which is connected to said antenna through said low-pass and high-pass filters;

a circuit provided just under said low pass filter or said high pass filter for separating a transmitting frequency and a receiving frequency, said circuit being constituted by at least lumped-constant or distributed-constant circuit element and a switching element; and signal-terminal, ground-terminal and bias-terminal patterns to be connected to the outside, said terminal patterns being formed on a lower surface of a lowermost one of said dielectric substrate layers, said signal, ground and bias terminal patterns being connected with said signal, ground and bias patterns provided on said respective dielectric substrate layers.

6. A mobile radio terminal comprising:

an antenna duplexer wherein transmitting and receiving frequency bands of a first system are $f_T(1)$ and $f_R(1)$ respectively, while transmitting and receiving frequency bands of a second system are $f_T(2)$ and $f_R(2)$; wherein a signal adapted to said first system and a signal adapted to said second system share an antenna terminal; wherein reception signals in said frequency bands $f_R(1)$ and $f_R(2)$ inputted from an antenna are received through said antenna terminal and sent to receiving-system terminals adapted to said first and second systems through a first parallel connection point, a switching circuit, a second parallel connection point and first and second separate filters respectively, said first parallel connection point being a connection point between receiving and transmitting systems adapted to said first and second systems, said switching circuit having a reflection coefficient the absolute value of which is not less than 0.8 in the frequency bands $f_T(1)$ and $f_T(2)$ viewed from said first parallel connection point when said switching circuit is OFF, said second parallel connection point being a connection point between receiving systems of said first and second systems, one of said first and second separate filters having said frequency band $f_R(1)$ as its pass band and having a reflection coefficient the absolute value of which is not less than 0.8 in the frequency band $f_R(2)$ viewed from said second parallel connection point, the other of said first and second separate filters having said frequency band $f_R(2)$ as its pass band and having a reflection coefficient the absolute value of which is not less than 0.8 in the frequency band $f_R(1)$ viewed from said second parallel connection point; wherein transmission signals in said frequency bands $f_T(1)$ and $f_T(2)$ adapted to said first and second systems are inputted to a transmitting-system terminal and sent to said antenna terminal through a switching circuit, said first parallel connection point and said low-pass filter or said high-pass filter respectively, said switching circuit having a reflection coefficient the absolute value of which is not less than 0.8 in said frequency bands $f_R(1)$ and $f_R(2)$ viewed from said first parallel connection point when said switching circuit is OFF;

a demodulating circuit for demodulating said reception signal outputted from said antenna duplexer; and a modulating circuit for modulating a base-band transmission signal into a transmission signal in said transmission frequency band through an off-set synthesizer;

said antenna duplexer including a reception system in which said reception signal in said receiving frequency band is outputted from an antenna through a third separate filter to said demodulating circuit, and a transmission system in which said transmission signal in said transmitting frequency band is outputted from said modulating circuit to said antenna through a switching element.

7. A switching antenna duplexer sharing a single antenna among systems using different transmitting and receiving frequencies respectively, transmitting and receiving frequency bands of a first one of said systems being $f_T(1)$ and $f_R(1)$ respectively, transmitting and receiving frequency bands of a second one of said systems being $f_T(2)$ and $f_R(2)$;

wherein a signal adapted to said first system and a signal adapted to said second system share an antenna terminal;

wherein reception signals in said frequency bands $f_R(1)$ and $f_R(2)$ inputted from said antenna are received through said antenna terminal and sent to receiving-system terminals adapted to said first and second systems through a first parallel connection point, a switching circuit, a second parallel connection point and first and second separate filters respectively, said first parallel connection point being a connection point between receiving and transmitting systems adapted to said first and second systems, said switching circuit having a reflection coefficient the absolute value of which is not less than 0.8 in the frequency bands $f_T(1)$ and $f_T(2)$ viewed from said first parallel connection point when said switching circuit is OFF, said second parallel connection point being a connection point between receiving systems of said first and second systems, one of said first and second separate filters having said frequency band $f_R(1)$ as its pass band and having a reflection coefficient the absolute value of which is not less than 0.8 in the frequency band $f_R(2)$ viewed from said second parallel connection point, the other of said first and second separate filters having said frequency band $f_R(2)$ as its pass band and having a reflection coefficient the absolute value of which is not less than 0.8 in the frequency band $f_R(1)$ viewed from said second parallel connection point;

wherein transmission signals in said frequency bands $f_T(1)$ and $f_T(2)$ adapted to said first and second systems are inputted to a transmitting-system terminal and sent to said antenna terminal through a switching circuit, said first parallel connection point and said low-pass filter or said high-pass filter respectively, said switching circuit having a reflection coefficient the absolute value of which is not less than 0.8 in said frequency bands $f_R(1)$ and $f_R(2)$ viewed from said first parallel connection point when said switching circuit is OFF.

* * * * *